(12) United States Patent
Flachowsky et al.

(10) Patent No.: US 8,471,342 B1
(45) Date of Patent: Jun. 25, 2013

(54) INTEGRATED CIRCUITS FORMED ON STRAINED SUBSTRATES AND INCLUDING RELAXED BUFFER LAYERS AND METHODS FOR THE MANUFACTURE THEREOF

(75) Inventors: Stefan Flachowsky, Dresden (DE); Jan Hoentschel, Dresden (DE)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 25 days.

(21) Appl. No.: 13/315,939

(22) Filed: Dec. 9, 2011

(51) Int. Cl.
  *H01L 21/70* (2006.01)
(52) U.S. Cl.
  USPC ..... 257/369; 438/199; 438/275; 257/E27.062
(58) Field of Classification Search
  USPC .................. 438/199, 275; 257/369, E27.062
  See application file for complete search history.

(56) References Cited

U.S. PATENT DOCUMENTS

| | | | |
|---|---|---|---|
| 7,091,095 B2 * | 8/2006 | Chu | 438/287 |
| 7,384,829 B2 * | 6/2008 | Cheng et al. | 438/153 |
| 8,183,627 B2 * | 5/2012 | Currie | 257/329 |
| 2012/0052653 A1 * | 3/2012 | Chidambarrao et al. | 438/424 |

OTHER PUBLICATIONS

"Fabrication and Mobility Characteristics of Ultra-thin Strained Si Directly on Insulator (SSDOI) MOSFETs," Rim et al., IBM Semiconductor Research and Development Center (SRDC) Research Division, 2003, pp. 1-4.

* cited by examiner

*Primary Examiner* — Trung Q Dang
(74) *Attorney, Agent, or Firm* — Ingrassia Fisher & Lorenz, P.C.

(57) ABSTRACT

Embodiments of a method for producing an integrated circuit are provided, as are embodiments of an integrated circuit. In one embodiment, the method includes providing a strained substrate having an n-active region and a p-active region, etching a cavity into one of the n-active region and the p-active region, embedding a relaxed buffer layer within the cavity, forming a body of strain material over the relaxed buffer layer having a strain orientation opposite that of the strained substrate, and fabricating n-type and t-type transistors over the n-active and p-active regions, respectively. The channel of the n-type transistor extends within one of the strained substrate and the body of strain material, while the channel of the p-type transistor extends within the other of the strained substrate and the body of strain material.

20 Claims, 3 Drawing Sheets

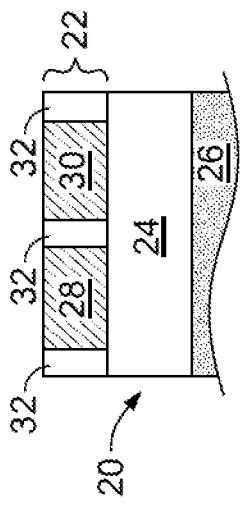
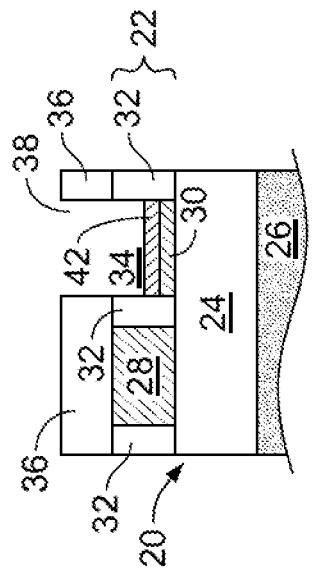
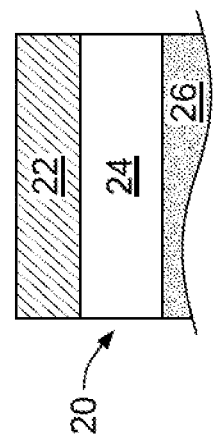
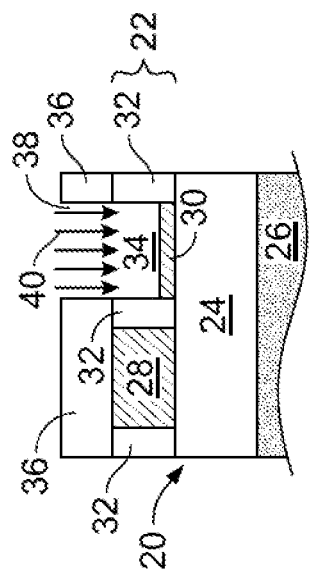

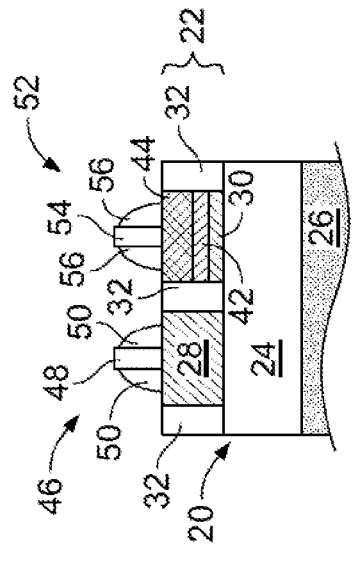
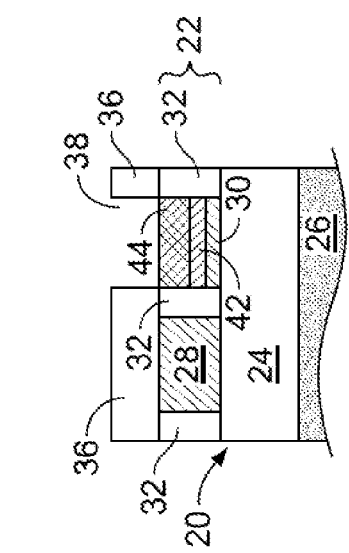
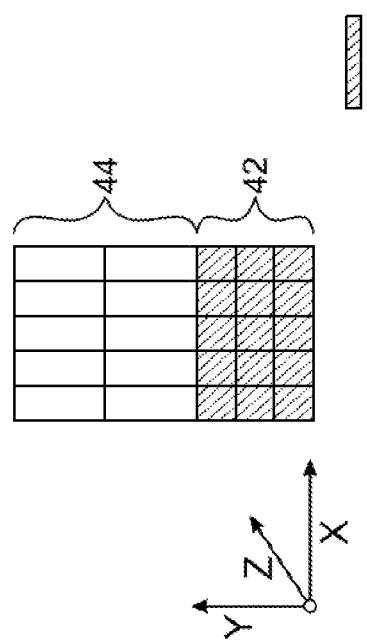

INTEGRATED CIRCUITS FORMED ON STRAINED SUBSTRATES AND INCLUDING RELAXED BUFFER LAYERS AND METHODS FOR THE MANUFACTURE THEREOF

TECHNICAL FIELD

The present invention relates generally to integrated circuits and, more particularly, to integrated circuits formed on strained substrates and including relaxed buffer layers over which opposing strain materials can be grown, as well as to methods for the manufacture thereof.

BACKGROUND

Although technically referring to a semiconductor device having a metal gate electrode and an oxide gate insulator, the term "MOS transistor" is now commonly utilized (and is utilized herein) to refer to any semiconductor device including a conductive gate electrode (whether metal or other conductive material) positioned over a gate insulator (whether oxide or other insulator), which is, in turn, positioned over a semiconductor substrate. The gain of a MOS transistor, usually defined by the transconductance ($g_m$), is proportional to the mobility ($\mu$) of the majority carrier in the transistor channel. The current carrying capacity, and hence the performance of a MOS transistor, is proportional to the mobility of the majority carrier in the channel. The mobility of holes, the majority carrier in a P-channel MOS (PMOS) transistor, can be enhanced by applying compressive stress to, and thereby inducing compressive strain within, the silicon of the PMOS channel region. Conversely, the mobility of electrons, the majority carrier in an N-channel MOS (NMOS) transistor, can be increased by applying tensile stress to, and thereby inducing a tensile strain within, the silicon of the NMOS channel region. Conventionally-known stress engineering methods are capable of greatly enhancing transistor performance by improving drive current and switching speed without increasing device size and capacitance. In addition, it is known that the threshold voltage of a particular type of transistor (e.g., PMOS transistors) can be adjusted by embedding strain materials (e.g., silicon germanium) within the transistor channel regions.

Semiconductor manufacturers have expressed increasing interest in the usage of tensile strained silicon-on-insulator (SOI) substrates, which include a layer of tensile strained silicon disposed over an electrically-insulative oxide layer supported by a silicon carrier wafer. In addition to providing the benefits generally associated with SOI substrates (e.g., lower parasitic capacitances, higher operational speeds, and higher integration densities), strained SOI substrates enable relatively high levels of tensile stress to be introduced directly into the channel regions of an integrated circuit's NMOS transistors in an efficient and uniform manner. However, if utilized in conjunction with tensile strained SOI substrates, the above-described techniques for adjusting the threshold voltage of the PMOS transistors by embedding epitaxially-grown SiGe within the transistor channel region are rendered less effective, if not wholly ineffective. In particular, if grown over tensile strained silicon, the SiGe layer will form in a bi-axially expanded state to accommodate the larger lattice constant of the tensile strained silicon. The compressive strain typically imparted to the epitaxially-grown SiGe layer will thus be significantly reduced, and little to no threshold voltage shift will be realized for any PMOS transistor ultimately fabricated over the SiGe layer. This is especially problematic in the case of PMOS transistors incorporating high-k/metal gate stacks, which generally require significant shifts in threshold voltage to enable the usage of metals capable of withstanding the high thermal budgets typically entailed by conventional integrated circuit process flows.

It would thus be desirable to provide methods for fabricating integrated circuits on tensile strained substrates, which enable compressively-strain materials to be introduced into the PMOS transistor channels to, for example, achieve strong threshold voltage shifts enabling or facilitating the usage of high-k/metal gate stacks. More generally, it would be desirable to provide methods for fabricating integrated circuits on strained substrates, whether tensile strained or compressively-strained, allowing strain material having an orientation opposite that of the strained substrate to be incorporated into the channels of a particular type of transistor, whether PMOS or NMOS, to optimize carrier mobility, drive current, and threshold voltage of all transistors included within the integrated circuit. Finally, it would be desirable to provide embodiments of an integrated circuit produced in accordance with such a method. Other desirable features and characteristics of the present invention will become apparent from the subsequent detailed description and the appended Claims, taken in conjunction with the accompanying Drawings and the foregoing Technical Field and Background.

BRIEF SUMMARY

Embodiments of a method for fabricating a strained semiconductor device are provided. In one embodiment, the method includes providing a strained substrate having an n-active region and a p-active region, etching a cavity into one of the n-active region and the p-active region, embedding a relaxed buffer layer within the cavity, forming a body of strain material over the relaxed buffer layer having a strain orientation opposite that of the strained substrate, and fabricating n-type and p-type transistors over the n-active and p-active regions, respectively. The channel of the n-type transistor extends within one of the strained substrate and the body of strain material, while the channel of the p-type transistor extends within the other of the strained substrate and the body of strain material.

Embodiments of an integrated circuit are further provided. In one embodiment, the integrated circuit includes a strained silicon-on-insulator (SOI) substrate having a tensile strained silicon layer, n-active and p-active and regions within the tensile strained silicon layer, a relaxed buffer layer embedded within the p-active region and positioned over the tensile strained silicon layer, a body of compressively-strained material formed within the p-active region over the relaxed buffer layer, and n-type and p-type transistors formed over the n-active and the p-active regions, respectively. The channel of the n-type transistor extends within the tensile strained silicon layer of the strained SOI substrate, and the channel of the p-type transistor extends within the body of compressively-strained material.

BRIEF DESCRIPTION OF THE DRAWINGS

The present invention will hereinafter be described in conjunction with the following drawing figures, wherein like numerals denote like elements, and wherein:

FIGS. 3-8 are simplified cross-sectional views of an integrated circuit (partially shown) at various stages of manufacture and produced in accordance with an exemplary embodiment of the present invention; and FIG. 9 is a cross-sectional schematic view of a compressively-strained silicon layer grown over a relaxed silicon-carbon layer in accordance with an exemplary embodiment of the present invention to more clearly illustrate strain.

DETAILED DESCRIPTION

The following Detailed Description is merely exemplary in nature and is not intended to limit the invention or the application and uses of the invention. Furthermore, there is no intention to be bound by any expressed or implied theory presented in the preceding Technical Field, Background, Brief Summary, or the following Detailed Description.

Figure 1:
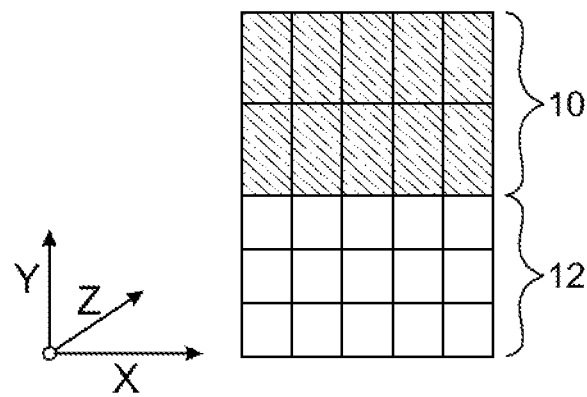
FIGS. 1 and 2 are cross-sectional schematic views of a silicon-germanium layer grown over a conventional silicon substrate and a tensile strained silicon substrate, respectively, wherein lattice structures are generically depicted as interconnected blocks to more clearly illustrate strain.
Figure 2:
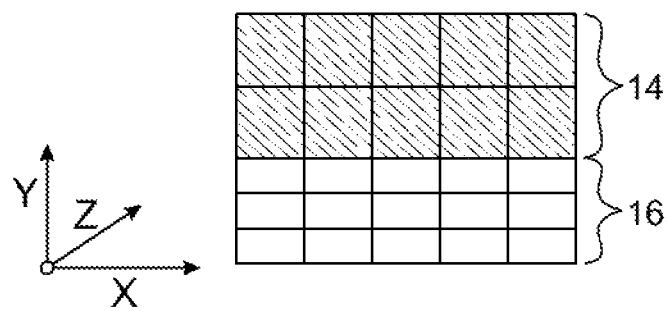

As described in the foregoing section entitled "BACKGROUND," in certain known fabrication techniques, the threshold voltage of a particular type of transistor may be adjusted by embedding an appropriate type of strain material within the transistors' channel regions. This may be more fully appreciated by referring to FIG. 1, which depicts a layer of silicon germanium 10 epitaxially grown over a region of a conventional silicon substrate 12 on which one or more PMOS transistors are fabricated (not shown). The lattice structures of layers 10 and 12 are generically depicted as interconnected blocks in FIG. 1 to more clearly illustrate strain. As can be seen, the lattice structure of epitaxially-grown silicon-germanium (eSiGe) layer 10, which has a higher lattice constant than does pure silicon, has formed in a bi-axially compressed state (that is, compressed along axes "X" and "Z" in FIG. 1) to align with the lattice structure of silicon substrate 12. As a result of this bi-axial compressive strain imparted to eSiGe layer 10, the mobility of holes within eSiGe layer 10 is increased and the threshold voltage of the PMOS transistor or transistors fabricated over layer 10 will be favorably reduced. By comparison, FIG. 2 illustrates a layer of eSiGe 14 grown over a tensile strained silicon layer 16. As tensile strained silicon layer 16 has a lattice constant approaching that of silicon-germanium, the lattice of eSiGe layer 14 aligns with tensile strained silicon layer 16 with little to no compression. As a result, eSiGe layer 14 is grown in a relaxed state, little to no improvement in carrier mobility is achieved, and the threshold voltage of the PMOS transistor or transistors fabricated over eSiGe layer 14 is substantially unaffected.

The following describes exemplary embodiments of a method for fabricating integrated circuits on strained substrates having a first strain type or orientation, which allows strain materials of a second type to be locally incorporated into the channels of a particular type of transistor to optimize carrier mobility, drive current, and threshold voltage of both NMOS and PMOS transistors included within the integrated circuit. In the exemplary embodiment described below, an integrated circuit is fabricated on a tensile strained silicon-on-insulator (SOI) substrate. Consequently, the below-detailed processing steps (e.g., etching, growth of a relaxed buffer layer over the tensile strained silicon layer of the SOI substrate, and growth of a compressively-strained layer over the relaxed buffer layer, as described in detail below) are performed for the region of the substrate on which the PMOS transistors are fabricated (referred to herein as the "p-active region"). This example notwithstanding, it is emphasized that embodiments of the below-described manufacturing method can also be utilized to produce integrated circuits on compressively-strained substrates wherein the n-active region is processed with appropriate changes in strain materials. Furthermore, various steps in the manufacture of MOS transistors are well-known and, in the interests of brevity, will only be mentioned briefly herein or will be omitted entirely without providing the well-known process details.

FIGS. 3-8 are simplified cross-sectional views of an integrated circuit at various stages of manufacture and produced in accordance with an exemplary embodiment of the present invention. Only a small portion of the integrated circuit is shown in FIGS. 3-8 in which a pair of complementary transistors are fabricated; however, it will be appreciated that the numerous other transistors included within the integrated circuit are simultaneously produced alongside the illustrated transistors during the course of the below-described fabrication method. Referring initially to FIG. 3, the exemplary circuit manufacturing method commences with the provision of a strained substrate 20. Strained substrate 20 can be any substrate or wafer including a silicon or silicon-containing layer or body, which is imparted with a tensile or compressive strain and on which a plurality of semiconductor devices can be fabricated. Strained silicon substrate 20 can thus be a bulk silicon wafer composed of tensile strained or compressively-strained silicon. In the illustrated example, strained silicon substrate 20 is a strained SOI substrate including an upper strained silicon layer 22 overlying an intermediate insulating layer 24 (also commonly referred to as a "buried oxide" or "BOX" layer), which is supported by a silicon carrier wafer 26. As appearing herein, "silicon layer," "silicon substrate," and similar terms and phrases encompass bodies composed of relatively pure silicon materials typically utilized in the semiconductor industry, as well as silicon admixed with other elements, such as germanium, carbon, indium, and the like. Silicon layer 22 is preferably composed of essentially pure, undoped silicon; that is, silicon containing less than about 1% dopants or other impurities, by weight. Silicon layer 22 can be either tensile or compressively-strained; however, to provide a non-limiting example useful in explaining the teachings of the present invention, the following describes an exemplary method wherein silicon layer 22 is tensile strained and will consequently be referred to below as such. Strained silicon layer 22 is preferably about 60 to 80 nanometers (nm) thick. The thicknesses of insulating layer 24 and carrier wafer 26 will vary amongst different embodiments, but may be about 140 nm and about 800 microns, respectively, in one embodiment.

Referring to FIG. 4, additional processing is next performed to define an n-active area 28 and a p-active area 30 in tensile strained silicon layer 22. The phrases "n-active area" and "p-active area" denote the area of strained SOI substrate 20 on which one or more NMOS or PMOS transistors are fabricated, respectively. For example, one or more electrical isolation features are formed within strained SOI substrate 20 utilizing a known electrical isolation technique, such as the localized oxidation of silicon. In the illustrated exemplary embodiment, a shallow trench isolation (STI) formation technique is utilized to form STI features 32 within tensile strained silicon layer 22. STI features 32 may be formed by, for example, initially etching a shallow trench into overlying silicon layer 22, growing a thermal oxide liner within the etched trench, and subsequently filling the trench by depositing an oxide into the trench and over the thermal oxide liner. After the formation of STI features 32, well regions can be implanted within overlying silicon layer 22 and within the boundaries of STI features 32 to further define n-active area 28 and p-active area 30; e.g., a p-type well region can be formed within n-active area 28 via the implantation of boron ions, while an n-type well region can be formed within p-active area 30 via the implantation of arsenic or phosphorus ions.

Next, either the n-active region or the p-active region is selectively etched to produce a cavity therein. In the exemplary embodiment wherein SOI substrate 20 includes a tensile strained silicon layer 22, p-active region 30 is selectively etched to produce a cavity 34 within upper silicon layer 22 adjacent the STI feature 32 isolating regions 28 and 30 (shown in FIG. 5). Selective etching of p-active region 30 can be carried-out by first positioning a mask 36 over the partially-fabricated integrated circuit having openings 38 through which the p-active regions are exposed (only one which is shown in FIG. 5). As represented by arrows 40, an etching process is then utilized to remove a portion of p-active region 32 through etch mask opening 38, while n-active region 28 is left un-etched or intact. An anisotropic dry etch, such as a reactive ion etch, can be performed utilizing a silicon-selective chemistry (e.g., Cl or $HBr/O_2$) to remove the bulk of p-active region 30 and thereby produce cavity 34 within tensile strained silicon layer 22. Alternatively, a wet etch can be performed utilizing an etch chemistry, such as a $HNF_3$ or HF, selective to the material of p-active region 32 (e.g., silicon) over the material of the neighboring STI features 32. The etching process parameters are advantageously controlled such that p-active region 30 is only partially removed to provide a relatively thin layer of silicon over which the strain buffer layer can be grown, as described more fully below in conjunction with FIG. 6. In a preferred embodiment, a majority of the silicon of p-active region 30 is removed during etching, as taken through the thickness of strained silicon layer 22. As a more specific example, approximately 70% of the thickness of p-active region 30 may be removed, which is equivalent to about 42 to about 56 nanometers in embodiments wherein strained silicon layer 22 is about 60 to about 80 nm thick, as previously indicated. Selective etching of p-active region 30 thus leaves a relatively thin layer of tensile strained silicon disposed within cavity 34 above the underlying BOX layer 24; e.g., in keeping with the above-mentioned exemplary dimensions, the remaining silicon layer defining p-active region 30 may be about 18 to about 24 nm thick.

After cavity 34 is produced within upper silicon layer 22, a relaxed buffer layer 42 is formed within cavity 34 and over the remaining silicon of p-active region 30, as illustrated in FIG. 6. As appearing herein, the term "relaxed buffer layer" is utilized to denote a layer formed over an underlying strained layer in a fully or partially-relaxed state, as compared to the underlying strain layer. Relaxed buffer layer 42 is conveniently epitaxially grown over the remaining silicon of p-active region 30, while mask 36 remains positioned over the partially-fabricated integrated circuit. A selective epitaxial growth process is carried-out such that the buffer layer grows exclusively on exposed crystalline material and not on, for example, mask 36. Buffer layer 42 is preferably formed from a material, such as silicon-carbon, having a lattice constant less than the lattice constant of pure crystalline silicon. When a material, such as silicon-carbon ("Si:C"), is epitaxially grown over a strained silicon layer having a sufficiently high lattice mismatch as compared to the underlying strained silicon, dislocations between the two disparate lattices will occur thereby enabling buffer layer 42 to grow in an essentially unstrained or relaxed state. For example, while a Si:C buffer layer may be formed over a tensile strained silicon layer (e.g., layer 22) utilizing a selective epitaxial growth technique, dislocations will occur at the lattice interface due to the extremely high lattice mismatch between the epitaxially-grown Si:C layer, which is (in a relative sense) bi-axially compressed, and the underlying tensile strained silicon, which is bi-axially stretched, thereby relaxing the stress of the Si:C buffer layer.

The temperature and duration of the selective epitaxial growth process utilized to produce relaxed buffer layer 42 will generally depend upon the desired thickness of relaxed buffer layer 42, which may be, for example, about 15 to about 20 nm. As a specific example, a silicon-carbon buffer layer can be grown over the remaining silicon of p-active region 30 by heating strained substrate 20 to a temperature between about 550 and about 650 degrees Celsius for a duration between about 10 and about 20 minutes in the presence of a carbon source, such as Monomethylysilan ($SiH_3CH_3$). Buffer layer 42 may be grown to a thickness greater or less than the exemplary thicknesses set-forth above; however, regardless of its particular thickness, it is generally preferred that buffer layer 42 is grown to partially fill, but not completely fill, the cavity etched into p-active region 30

Turning now to FIG. 7, a discrete body of strain material 44 is formed over relaxed buffer layer 42 within cavity 34 and, thus, embedded within strained silicon layer 22 of SOI substrate 20. In preferred embodiments, body of strain material 44 is selectively epitaxially grown over relaxed buffer layer 42 to fill the remainder of cavity 34 (FIG. 6) such that the upper surface of strain material 44 is substantially even or flush with the upper surface of strained silicon layer 22 of substrate 24; e.g., in one implementation, body of strain material 44 is grown to a thickness between about 27 and about 36 nm. However, if overgrowth of the epitaxially-grown strain material should occur, such overgrowth can be removed utilizing a polishing or grinding process, such as chemical mechanical planarization. As was relaxed buffer layer 42, strain material 44 is conveniently selectively epitaxially grown while mask 36 remains positioned over the partially-fabricated integrated circuit. However, in the case of strain material 44, the partially-fabricated integrated circuit is heated in the presence of a silicon or silicon-containing precursor material to grow a strained silicon or silicon-containing layer. Notably, body of strain material 44 is grown to have strain type or orientation opposite that of strained silicon layer 22. Thus, in the illustrated example wherein silicon layer 22 is tensile strained, body of strain material 44 is grown in a compressively-strained state. Suitable compressively-strain materials include, but are not limited to, pure compressively-strained silicon, silicon germanium, and silicon indium. These examples notwithstanding, body of strain material 44 is preferably grown from pure compressively-strained silicon (i.e., silicon containing less than about 1% impurities, by weight). to minimize or eliminate alloy scattering and thereby optimize carrier mobility with the PMOS transistor channel region. In embodiments wherein relaxed buffer layer 42 is composed of a material (e.g., silicon-carbon) having a lattice constant less than pure crystalline silicon, such an epitaxially-grown pure silicon layer will naturally form in a bi-axially compressed state to align with smaller lattice structure of the underlying buffer layer, as further described below in conjunction with FIG. 9.

After formation of strain material 44, additional processing steps are performed to complete fabrication of the integrated circuit. As shown in FIG. 8, such processing steps include the formation of an n-type or NMOS transistor 46 including a gate stack 48 and sidewall spacers 50 over n-active region 28, and a p-type or PMOS transistor 52 including a gate stack 54 and sidewall spacers 56 over p-active region 30. Gate stacks 48 and 54 are preferably high-k/metal gate (HK/MG) stacks; that is, gate stacks including a layer of material having a high dielectric constant as compared to silicon dioxide (e.g., hafnium silicate, zirconium silicate, hafnium dioxide, or zirconium dioxide) and a metal gate alone or in combination with other layers, such as an oxide layer disposed over the high-k insulator, a poly crystalline silicon layer disposed above the metal gate, and/or a silicide layer disposed above the polycrystalline silicon layer. Such a HK/MG stacks are advantageously produced utilizing a gate first approach and combined with strained SOI substrate of the type described herein to achieve significant performance enhancements in the final integrated circuit. Conventional processing steps can then be performed to complete fabrication of the integrated circuit.

Pursuant to the above-described fabrication process, the channel of NMOS transistor 52 extends within the tensile strained parent material of strained silicon layer 22 of SOI substrate 20, while the channel of PMOS transistor 52 extends within the compressively-strained body of strain material 44. Thus, by utilizing a relaxed buffer layer (e.g., a silicon-carbon buffer layer) to grow a biaxial compressively-strained silicon channel over the etched region of strained substrate 20, PMOS transistor 52 (and the other non-illustrated PMOS transistors included within the integrated circuit) are optimized with respect to threshold voltage and carrier mobility; while NMOS transistor 46 (and the other non-illustrated NMOS transistors included within the integrated circuit) utilize the tensile strained silicon provided by substrate 20 to improve carrier mobility and increase drive current. The bi-axially compressed state of locally-grown strain material 44 may be more fully appreciated by referring to FIG. 9, which is a cross-sectional view of a portion of strain layer 44 grown over a portion of relaxed buffer layer 42. As was the case with FIGS. 1 and 2, the lattice structures of layers 44 and 42 are generically depicted in FIG. 9 as interconnected blocks to more clearly illustrate strain. As can be seen, the lattice structure of epitaxially-grown strain material 44 (e.g., pure silicon) has compressed along a first axis (identified as "X" in FIG. 1) to align with the lattice structure of underlying buffer layer 42, which is composed of silicon-carbon or another material having a relatively small lattice constant; as may be appreciated by comparing FIG. 9 to FIG. 1, relaxed buffer layer 42 is represented by smaller interconnected squares as compared to pure silicon substrate 12 to indicate that, in preferred embodiments, relaxed buffer layer 42 is composed of silicon-carbon having a smaller lattice constant than does pure crystalline silicon. In addition, epitaxially-grown strain material 44 has compressed along second axis perpendicular to the first axis (identified as "Z" in FIG. 1) to further align with the lattice structure of buffer layer 42. As a result, epitaxially-grown strain material 44 is compressively strained in bi-axial directions, the mobility of holes in material 44 is increased, and the threshold voltage of PMOS transistor 52 (FIG. 8) formed over material 44 is favorably lowered.

The foregoing has thus provided embodiments of a method for fabricating integrated circuits on strained substrates allowing disparate strain materials to be locally incorporated into the channels of a particular type of transistor to optimize carrier mobility, drive current, and threshold voltage of the both NMOS and PMOS transistors included within the circuit. While the integrated circuit was fabricated on a tensile strained substrate in the above-described example, and while it was consequently the p-active area that was embedded with a compressively-strain material separated from the tensile strained substrate by a relaxed buffer layer, the foregoing principles are equally applicable to compressively-strained substrates. In particular, in an embodiment wherein the integrated circuit is produced on a compressively-strained substrate, the n-active region may be processes in the above-described manner; that is, etched to produce a cavity in which a layer of unstrained or relaxed material (e.g., silicon-carbon) is first grown followed by the growth of a layer of tensile strained material (e.g., tensile strained silicon) over which one or more NMOS transistors are ultimately fabricated.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing the exemplary embodiment or exemplary embodiments. It should be understood that various changes can be made in the function and arrangement of elements without departing from the scope of the invention, as set forth in the appended Claims and the legal equivalents thereof.

What is claimed is:

1. A method for producing an integrated circuit, comprising:
    providing a strained substrate having an n-active region and a p-active region;
    etching a cavity into one of the n-active region and the p-active region;
    embedding a relaxed buffer layer within the cavity;
    forming a body of strain material over the relaxed buffer layer having a strain orientation opposite that of the strained substrate; and
    fabricating n-type and p-type transistors over the n-active and p-active regions, respectively, the channel of the n-type transistor extending within one of the strained substrate and the body of strain material, and the channel of the p-type transistor extending within the other of the strained substrate and the body of strain material.

2. A method according to claim 1 wherein embedding comprises epitaxially growing a relaxed buffer layer within the cavity and over the strained substrate.

3. A method according to claim 2 wherein epitaxially growing comprises epitaxially growing a silicon-carbon layer within the cavity and over the strained substrate.

4. A method according to claim 2 wherein epitaxially growing comprises epitaxially growing the relaxed buffer layer to a predetermined thickness partially filling the cavity.

5. A method according to claim 4 wherein forming a body of strain material comprises epitaxially growing a body of strain material over the relaxed buffer layer.

6. A method according to claim 5 wherein epitaxially growing a body of strain material comprises epitaxially growing a body of strain material within the cavity and over the relaxed buffer layer to fill the cavity.

7. A method according to claim 5 wherein epitaxially growing a body of strain material comprises epitaxially growing a body of strain material within the cavity and over the relaxed buffer layer to a thickness at which the upper surface of the body of strain material is substantially even with the upper surface of the strained substrate.

8. A method according to claim 1 further comprising forming an electrical isolation feature between the n-active region and the p-active region, and wherein etching comprises etching a cavity into strained substrate adjacent the electrical isolation feature.

9. A method according to claim 1 wherein providing comprises providing a tensile strained silicon-on-insulator (SOI) substrate comprising:

a carrier wafer;
a buried oxide layer disposed over the carrier layer; and
a strained silicon layer disposed over the buried oxide layer in which the n-active and p-active regions are formed.

10. A method according to claim 9 wherein etching comprises forming a cavity in one of the n-active region and the p-active region extending into, but not fully through the strained silicon layer.

11. A method according to claim 9 wherein the strained silicon layer of the SOI substrate comprises tensile strained silicon.

12. A method according to claim 11 wherein:
etching comprises etching a cavity into the p-active region;
forming a body of strain material comprises forming a body of compressive strain material over the relaxed buffer layer; and
fabricating comprises fabricating n-type and p-type transistors over the n-active and p-active regions, respectively, the channel of the n-type transistor extending within the tensile strained silicon layer, and the channel of the p-type transistor extending within the body of compressive strain material.

13. A method according to claim 12 wherein forming a body of compressive strain material comprises epitaxially growing a body of compressive strain material over the relaxed buffer layer, the body of compressive strain material selected from the group consisting of pure silicon, silicon germanium, and silicon indium.

14. A method according to claim 13 wherein forming a body of compressive strain material comprises epitaxially growing a layer of pure silicon over the relaxed buffer layer.

15. A method according to claim 1 further comprising disposing a mask over the partially-fabricated integrated circuit through which one of the p-active region and the n-active region is exposed, wherein:
etching comprises etching one of the p-active and the n-active region through the mask;
embedding comprises epitaxially growing a body of strain material within the cavity and over the strained substrate while the mask remains positioned over the partially-fabricated integrated circuit; and
forming comprises epitaxially growing a body of strain material over the relaxed buffer layer while the mask remains positioned over the partially-fabricated integrated circuit.

16. A method for manufacturing an integrated circuit, comprising:
providing a strained substrate having a tensile strained silicon layer;
etching the tensile strained silicon layer to produce a cavity therein;
epitaxially growing a relaxed buffer layer in the cavity;
forming a body of compressively-strained material over the relaxed buffer layer; and
fabricating a p-type transistor on the strained substrate having a channel extending within the body of compressively-strained material.

17. A method according to claim 16 wherein epitaxially growing comprises epitaxially growing a relaxed buffer layer in the cavity from a material having a lattice constant less than the lattice constant of the tensile strained silicon layer, and wherein forming comprises epitaxially growing a body of compressively-strained material over the relaxed buffer layer from a material having a lattice constant greater than the lattice constant of the relaxed buffer layer.

18. A method according to claim 16 wherein epitaxially growing comprises epitaxially growing a relaxed buffer layer in the cavity comprising silicon-carbon, and wherein forming comprises epitaxially growing a body of compressively-strained material over the relaxed buffer layer consisting essentially of pure silicon.

19. A method according to claim 16 wherein fabricating comprises fabricating a p-type transistor over the strained substrate including a high-k metal gate stack.

20. An integrated circuit, comprising:
a strained silicon-on-insulator (SOI) substrate having a tensile strained silicon layer;
n-active and p-active and regions within the tensile strained silicon layer;
a relaxed buffer layer embedded within the p-active region and positioned over the tensile strained silicon layer;
a body of compressively-strained material formed within the p-active region over the relaxed buffer layer; and
n-type and p-type transistors formed over the n-active and the p-active regions, respectively, the channel of the n-type transistor extending within the tensile strained silicon layer of the strained SOI substrate, and the channel of the p-type transistor extending within the body of compressively-strained material.

* * * * *